United States Patent
Oh et al.

(10) Patent No.: US 10,199,596 B2
(45) Date of Patent: Feb. 5, 2019

(54) FLEXIBLE ORGANIC LIGHT EMITTING DISPLAY DEVICE

(71) Applicant: LG DISPLAY CO., LTD., Seoul (KR)

(72) Inventors: Yeonjun Oh, Gimpo-si (KR); Jonghyun Park, Seoul (KR); Jaekyung Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/394,102

(22) Filed: Dec. 29, 2016

(65) Prior Publication Data
US 2018/0006266 A1   Jan. 4, 2018

(30) Foreign Application Priority Data
Jun. 30, 2016   (KR) .................. 10-2016-0082716

(51) Int. Cl.
*H01L 29/08* (2006.01)
*H01L 51/52* (2006.01)
*H01L 51/00* (2006.01)
*H01L 51/05* (2006.01)
*H01L 27/12* (2006.01)

(52) U.S. Cl.
CPC ...... *H01L 51/5246* (2013.01); *H01L 51/0097* (2013.01); *H01L 51/0545* (2013.01); *H01L 51/5253* (2013.01); *H01L 27/12* (2013.01); *H01L 51/0036* (2013.01); *H01L 51/0512* (2013.01); *H01L 51/0541* (2013.01)

(58) Field of Classification Search
CPC .............. H01L 51/545; H01L 51/0036; H01L 51/0541; H01L 51/5012; H01L 51/5246; H01L 51/0097; H01L 51/5253; H01L 51/5253

USPC ............ 257/40, 59, 72; 438/82, 99, 48, 128
See application file for complete search history.

(56) References Cited

U.S. PATENT DOCUMENTS

| | | | |
|---|---|---|---|
| 9,095,018 B2 * | 7/2015 | Masuda | H01L 51/5246 |
| 2004/0239864 A1 | 12/2004 | Asakawa | |
| 2012/0320329 A1 * | 12/2012 | Lee | G02F 1/133305 349/158 |
| 2014/0036205 A1 * | 2/2014 | Sugiura | H01L 25/0753 349/69 |
| 2014/0184059 A1 * | 7/2014 | Masuda | H01L 51/5246 313/512 |
| 2014/0204285 A1 | 7/2014 | Jang | |
| 2015/0062524 A1 * | 3/2015 | Kim | G02F 1/1339 349/153 |
| 2016/0011445 A1 * | 1/2016 | Chen | G02F 1/1337 349/110 |
| 2016/0343954 A1 * | 11/2016 | Seo | H01L 51/0067 |
| 2017/0186971 A1 * | 6/2017 | Kanamoto | C07D 491/048 |
| 2017/0371189 A1 * | 12/2017 | Yen | G02F 1/1339 |

FOREIGN PATENT DOCUMENTS

TW   201330246 A1   7/2013

* cited by examiner

*Primary Examiner* — Thinh T Nguyen
(74) *Attorney, Agent, or Firm* — Seed Intellectual Property Law Group LLP

(57) ABSTRACT

A flexible organic light emitting display device includes a substrate having a display area and a side sealant pattern covering a portion outside the display area, wherein the side sealant pattern has a first width and a second width narrower than the first width, in the side sealant pattern, a pattern with the first width and a pattern with the second width alternate.

11 Claims, 14 Drawing Sheets

(a)          (b)

(a)  (b)

(a)

(b)

FLEXIBLE ORGANIC LIGHT EMITTING DISPLAY DEVICE

CROSS-REFERENCE TO RELATED APPLICATIONS

This application claims the priority benefit of Korean Patent Application No. 10-2016-0082716 filed on Jun. 30, 2016 which is incorporated herein by reference for all purposes as if fully set forth herein.

BACKGROUND

Technical Field

The present disclosure relates to a flexible organic light emitting display device.

Description of the Related Art

As information technologies have advanced, the market for display devices as a connection medium between users and information has grown. Accordingly, display devices such as organic light emitting display devices, liquid crystal displays (LCDs), and plasma display panels (PDPs) have been increasingly used.

Among them, an organic light emitting display device is a self-luminous device, and thus, the organic light emitting display device may consume less power and may be manufactured to be thin, compared with an LCD requiring a backlight. Also, the organic light emitting display device advantageously has a wide viewing angle and a fast response speed. A process technology of organic light emitting display devices has advanced to a mass-production technology level, so the market thereof has expanded in competition with LCDs.

Pixels of an organic light emitting display device includes an organic light emitting diode (OLED), a self-luminous device. The organic light emitting display device may be classified variously according to types of emission materials, emission schemes, emission structures, driving methods, and the like. The organic light emitting display device may be classified into a fluorescence type and a phosphorescence type according to emission schemes and may be classified into a top emission structure and a bottom emission structure according to emission structures. Also, the organic light emitting display device may be classified into a passive matrix organic light emitting diode (PMOLED) and an active matrix organic light emitting diode (AMOLED) according to driving schemes.

Recently, flexible display devices have been commercialized. Flexible display devices may reproduce an input image on a screen of a display panel in which a plastic OLED is formed. The plastic OLED is formed on a bendable plastic substrate. Flexible display devices may be implemented to have various designs and are advantageous in portability and durability. Flexible display devices may be implemented in various forms such as a bendable display device, a foldable display device, a rollable display device, and the like. Flexible display devices may be applied to televisions, vehicle displays, wearable devices, and the like, as well as, to mobile devices such as smartphones, tablet PCs, and the like, and an application field thereof has expanded.

BRIEF SUMMARY

An aspect of the present disclosure provides an organic light emitting display device having a side sealant with a preset pattern to thus secure sufficient flexibility of the side sealant.

In one aspect, there is provided a flexible organic light emitting display device including a substrate having a display area and a side sealant pattern covering a portion outside the display area, wherein the side sealant pattern has a first width and a second width narrower than the first width, in the side sealant pattern, a pattern with the first width and a pattern with the second width alternate.

In another aspect, there is provided a flexible organic light emitting display device including a substrate in which a display area implementing an input image and a non-display area outside the display area are defined; and a side sealant extending in one direction and having a preset pattern in the non-display area, wherein the preset pattern includes: a first section in which a width thereof is decreased in the one direction; and a second section in which a width thereof is increased in the one direction, wherein the first section and the second section alternate.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. In this disclosure, a detailed description of features, components or functions that may be known in the relevant arts will be omitted if inclusion of such description can mislead or is otherwise not helpful in the description of the various embodiments of the present disclosure. In describing various embodiments, the same components may be representatively described at the beginning and may be omitted in the description of other embodiments.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Figure 1:
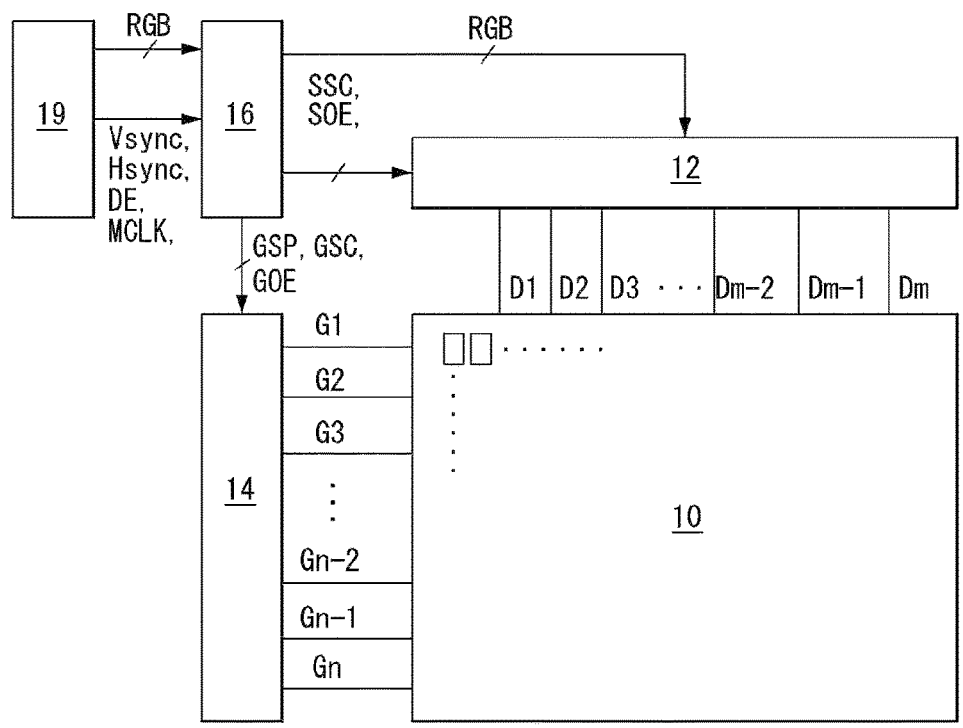
FIG. 1 is a view schematically illustrating a flexible organic light emitting display device according to one or more embodiments of the present disclosure.
Figure 2:
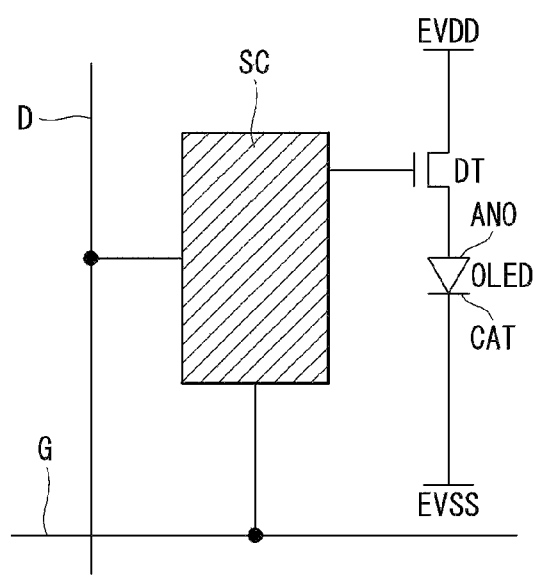
FIG. 2 is a view schematically illustrating a pixel of FIG. 1.
Figure 3:
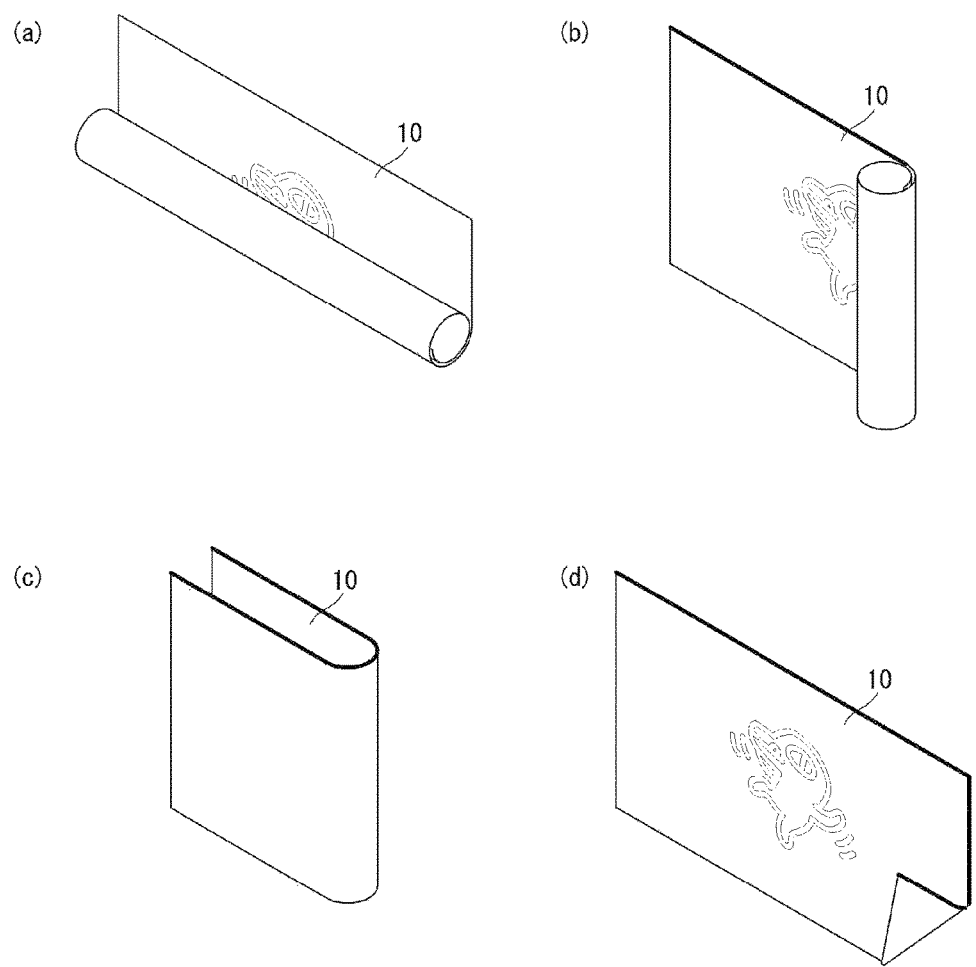
FIG. 3 is a view illustrating an example in which a state of a flexible display panel is changed.

FIG. 1 is a view schematically illustrating a flexible organic light emitting display device according to an embodiment of the present disclosure. FIG. 2 is a view schematically illustrating a pixel of FIG. 1. FIG. 3 is a view illustrating an example in which a state of a flexible display panel is changed.

Referring to FIG. 1, a rollable display device includes a display driving circuit and a flexible display panel 10.

The display driving circuit, including a data driving circuit 12, a gate driving circuit 14, and a timing controller 16, writes a video data voltage of an input image into pixels of a flexible display panel 10. The data driving circuit 12 converts digital video data RGB input from the timing controller 16 into an analog gamma compensation voltage to generate a data voltage. The data voltage output from the data driving circuit 12 is supplied to the data lines D1 to Dm. The gate driving circuit 14 sequentially supplies a gate signal synchronized with the data voltage to gate lines G1 to Gn to select pixels of the flexible display panel 10 into which the data voltage is written.

Receiving timing signals such as a vertical synchronization signal Vsync, a horizontal synchronization signal Hsync, a data enable signal DE, a main clock MCLK, and the like, from the host system 19, the timing controller 16 synchronizes operation timing of the data driving circuit 12 and the gate driving circuit 14. A data timing control signal for controlling the data driving circuit 12 includes a source sampling clock (SSC), a source output enable signal (SOE), and the like. A gate timing control signal for controlling the gate driving circuit 14 includes a gate start pulse (GSP), a gate shift clock (GSC), a gate output enable signal (GOE), and the like.

A host system 19 may be implemented as any one of a television system, a set-top box (STB), a navigation system, a DVD player, a Blu-ray player, a personal computer (PC), a home theater system, and a phone system. The host system 19, including a scaler-equipped system-on-chip (SoC), converts the digital video data RGB of the input image into an appropriate format to be displayed on the flexible display panel 10. The host system 19 transmits timing signals Vsync, Hsync, DE, and MCLK, together with the digital video data, to the timing controller 16.

A pixel array of the flexible display panel 10 includes pixels formed in pixel areas defined by data lines D1 to Dm (m is a positive integer) and gate lines G1 to Gn (n is a positive integer). Each of the pixels includes an organic light emitting diode (OLED), which is a self-luminous device.

Referring further to FIG. 2, in the flexible display panel 10, a plurality of data lines D and a plurality of gate lines G intersect with each other, and pixels are disposed in a matrix form in the intersections thereof. Each of the pixels includes an OLED, a driving thin film transistor (TFT) DT controlling an amount of current flowing in the OLED, and a programming unit SC for setting a voltage between a gate and a source of the driving TFT DT.

The programming unit SC may include at least one switch TFT and at least one storage capacitor. In response to a gate signal from the gate line G, the switch TFT is turned on to apply a data voltage from the data line D to one electrode of the storage capacitor. The driving TFT DT adjusts an amount of emitted light of the OLED by controlling an amount of current supplied to the OLED according to a magnitude of a voltage charged in the storage capacitor. An amount of emitted light of the OLED is proportional to an amount of current supplied from the driving TFT DT. The pixel is connected to a high potential voltage source EVDD and a low potential voltage source EVSS to receive a high potential source voltage and a low potential source voltage from a power generating unit (not shown). TFTs forming pixels may be implemented as p type or n type. Also, a semiconductor layer of each of the TFTs forming pixels may include amorphous silicon, polysilicon, or an oxide. The OLED includes an anode electrode ANO, a cathode electrode CAT, and an organic compound layer interposed between the anode electrode ANO and the cathode electrode CAT.

The anode electrode ANO is connected to the driving TFT DT. The organic compound layer may include an emission layer (EML) and may further include any one or more of a hole injection layer (HIL), a hole transport layer (HTL), an electron transport layer (ETL), and an electron injection layer (EIL).

Referring further to FIG. 3, the flexible display panel 10 includes a display area AA implementing an input image. A user may recognize information output from the flexible display panel 10 through the display area AA. The display area AA may be defined on any one surface of the flexible display panel 10, or may be defined on both surfaces of the flexible display panel 10. Also, the display area AA may be defined to be limited to a specific area as necessary.

The flexible display panel 10 may be rolled, wound, or folded. That is, predetermined ductility is provided to the flexible display panel 10 to easily and repeatedly perform a winding, folding, or unrolling (unwinding or unfolding) operation.

The flexible display panel 10 may be rolled and/or folded in various directions as may be desired. For example, the flexible display panel 10 may be rolled in a horizontal direction, in a vertical direction, or in a diagonal direction. The flexible display panel 10 may be rolled and/or folded in a forward direction and/or backward direction of the flexible display panel 10.

A change (e.g., rolled and/or folded) in a state of the flexible display panel 10 may be caused by a physical external force directly provided, for example, by the user. For example, the user may grip one end of the flexible display panel 10 and provide a force thereto to change a state of the flexible display panel 10. A change in a state of the flexible display panel 10 may be controlled by a selected driving device or a driving circuit. That is, a change in a state of the flexible display panel 10 may be controlled by a controller in response to a preset specific signal.

Figure 4:
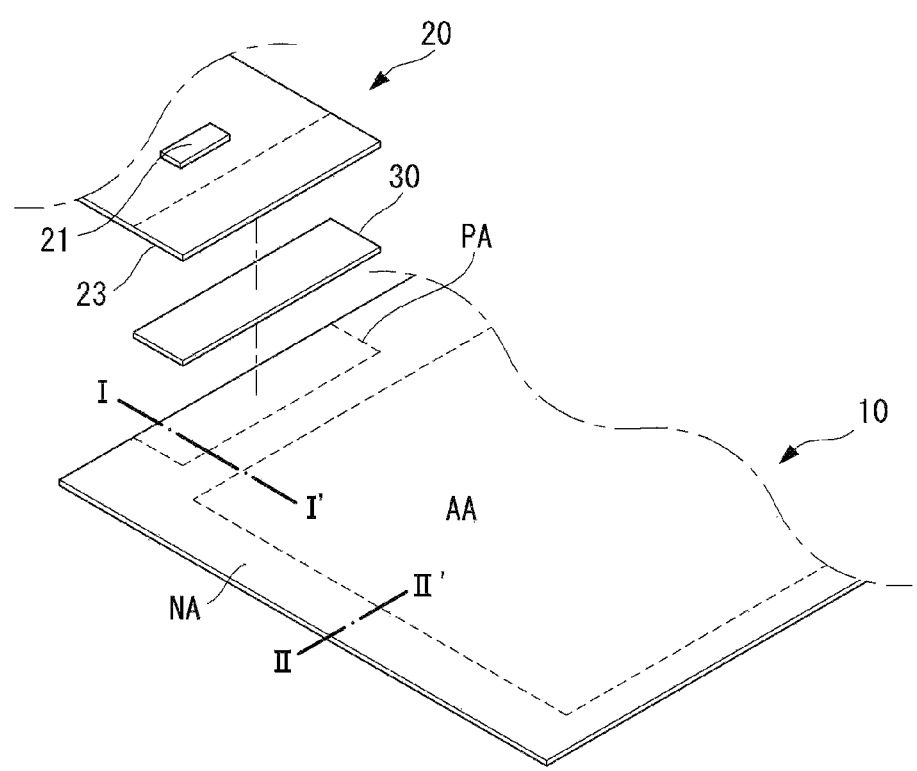
FIG. 4 is a perspective view illustrating a schematic structure of a flexible organic light emitting display device according to embodiments of the present disclosure.
Figure 5:
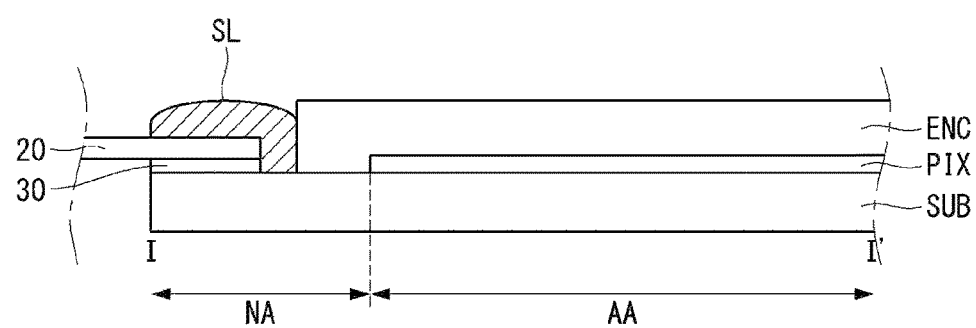
FIG. 5 is a cross-sectional view taken along line I-I' of FIG. 4.
Figure 6:
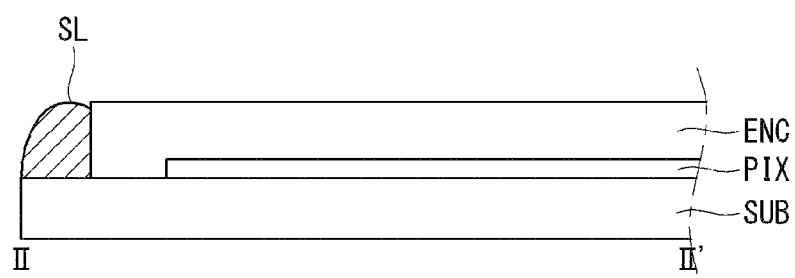
FIG. 6 is a cross-sectional view taken along line II-II' of FIG. 4.

FIG. 4 is a perspective view illustrating a schematic structure of a flexible organic light emitting display device according to an embodiment of the present disclosure. FIG. 5 is a cross-sectional view taken along line I-I' of FIG. 4. FIG. 6 is a cross-sectional view taken along line II-II' of FIG. 4.

Referring to FIG. 4, a flexible organic light emitting display device according to an embodiment of the present disclosure includes a flexible display panel 10, a flexible film 20, and an anisotropic conductive film (ACF) 30.

The flexible display panel 10 includes a display area AA implementing an input image and a non-display area NA outside the display area AA. A pad part PA is defined on any side of the non-display area NA. Pads are provided on the pad part PA and connected to signal lines for transferring a driving signal to the display area AA.

The flexible film 20 may be implemented as a chip-on-chip (COF) or a tape carrier package (TCP). The flexible film 20 includes a base film 23 and a driving integrated circuit (IC) 21 mounted on the base film 23. One end of the flexible film 20 is bonded to the pad part PA of the flexible display panel 10, and the other end thereof is connected to a printed circuit board (PCB). A plurality of elements such as an IC, or the like, are provided on the PCB to form a driving unit, and the driving unit generates various control signals and data signals for driving the flexible display panel 10 and transfers the generated signals to the flexible display panel 10.

The ACF layer 30 includes a resin with adhesive properties and conductive particles scattered therein. The ACF layer 30 is disposed between the pad part PA and one end of the flexible film 20, and the conductive particles may be connected to each other through thermo-compression bonding to electrically connect the flexible display panel 10 and the flexible film 20.

Referring further to FIGS. 5 and 6, the display area AA and the non-display area AA are defined on a substrate SUB. Pixels PIX are disposed on the display area AA, and each of the pixels PIX includes a plurality of elements such as a TFT, an OLED connected to the TFT, and the like. An encapsulation layer ENC is disposed to cover the pixels PIX arranged on the display area AA. The encapsulation layer ENC may block moisture or oxygen that may penetrate into the pixels PIX to protect a plurality of elements provided within the pixels PIX. The encapsulation layer ENC may be a face seal metal (FSM) but is not limited thereto. The FSM may include invar. Invar is an alloy of iron (Fe) and nickel (Ni) having a low coefficient of thermal expansion.

A side sealant SL is applied to (or coated on) the non-display area NA outside the substrate SUB, exposed to the outside. The side sealant SL is provided on an outer side of the substrate SUB to serve as a buffer unit buffering an external impact and also to serve as a means for preventing moisture transmission. Also, since the organic light emitting display device generally uses a heat-resistant plastic film such as polyimide (PI), a flexible material, as the substrate SUB, the device may be bent or rolled against a user intention during a process or while in use. The side sealant SL may be provided on the exposed substrate SUB to serve as a support unit for preventing the substrate SUB from being unintentionally bent or rolled.

The side sealant SL may be in contact with a side surface of the encapsulation layer ENC. The side sealant SL may be applied to have a thickness corresponding to a height of the encapsulation layer ENC to compensate for a step between the encapsulation layer ENC and the substrate SUB. Through step compensation using the side sealant SL, a defect that may occur during a manufacturing process may be prevented in advance. For example, in the case of the flexible display device, a film lamination process may be performed to attach a protective film on a front surface and/or rear surface of the display panel. Here, if a step between the encapsulation layer ENC and the substrate SUB is not compensated, bubbles may be generated in the step portion to cause defective driving.

The side sealant SL may be disposed to extend up to an upper surface of an edge of the flexible film 20. The side sealant SL may fix the flexible film 20 bonded to the substrate SUB to restrain and limit movement thereof. The side sealant SL may prevent separation of the flexible film 20 and protect a bonding portion between the substrate SUB and the flexible film 20.

When the flexible display panel is rolled or folded, stress acts on the flexible display panel. Such stress may also act on the side sealant SL formed in the non-display area NA to delaminate or crack the side sealant SL. Here, an effect intended to be obtained through a side sealing process may not be obtained. Thus, development of a novel side sealant pattern that may be able to secure sufficient flexibility to cope with a change in a state of a flexible display panel is desirable.

<Examples of Various Embodiments>

FIGS. 7 to 11 are views illustrating a flexible organic light emitting display device according to various embodiments of the present disclosure.

Figure 7:
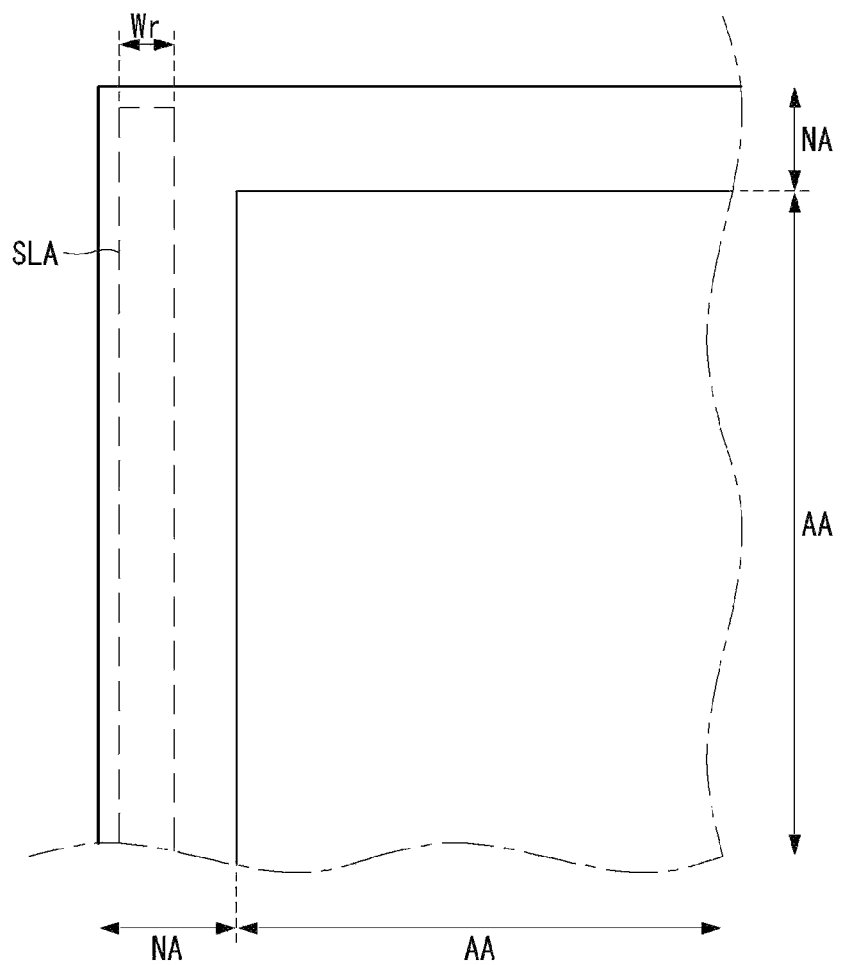
FIGS. 7 to 11 are views illustrating a flexible organic light emitting display device according to various embodiments of the present disclosure.

Referring to FIG. 7, a sealing area SLA is defined to extend in one direction from at least one side of the non-display area NA. The sealing area SLA has a preset reference width Wr, which corresponds to a widest portion of the side sealant SL (e.g., as shown in FIG. 7, with the first width W1 being equal to the reference width Wr). The reference width Wr is selected as a minimum width with which the side sealant SL performs an intrinsic function thereof. That is, in a case in which the sealing area SLA is set to have a width narrower than the reference width Wr, the aforementioned purpose of coating the side sealant SL may not be achieved. Conversely, if the sealing area SLA is set to have a width larger than the reference width Wr, a bezel area may be unnecessarily increased. Accordingly, it is preferable for the side sealant SL to include at least one width (e.g., the first width W1) that is equal to the reference width Wr, and one or more narrower widths positioned between two portions having the first width W1.

The side sealant SL is formed through a side sealing process. The side sealing process may be performed through a soluble scheme including an ink jet scheme, a gravure scheme, and a screen printing scheme. The side sealant SL may include an acryl-based resin and a urethane-based resin. However, the present disclosure is not limited thereto.

Figure 8:
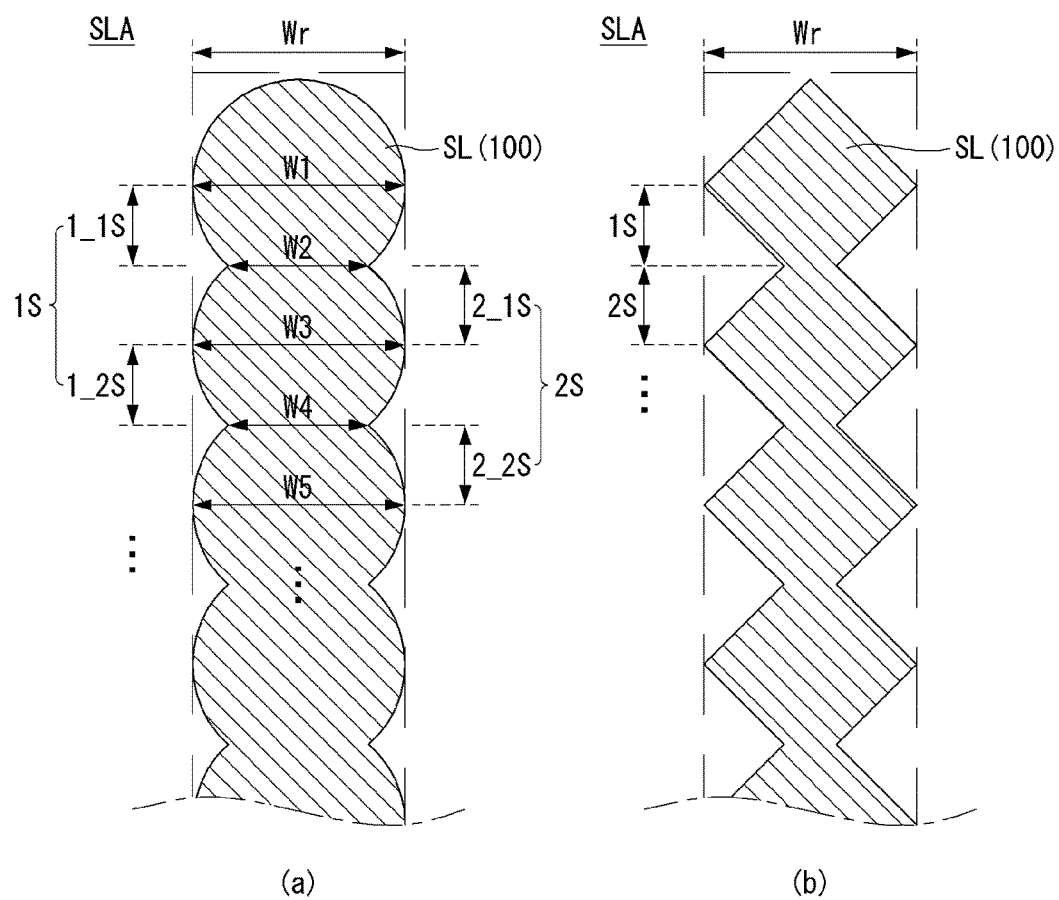
Figure 9:
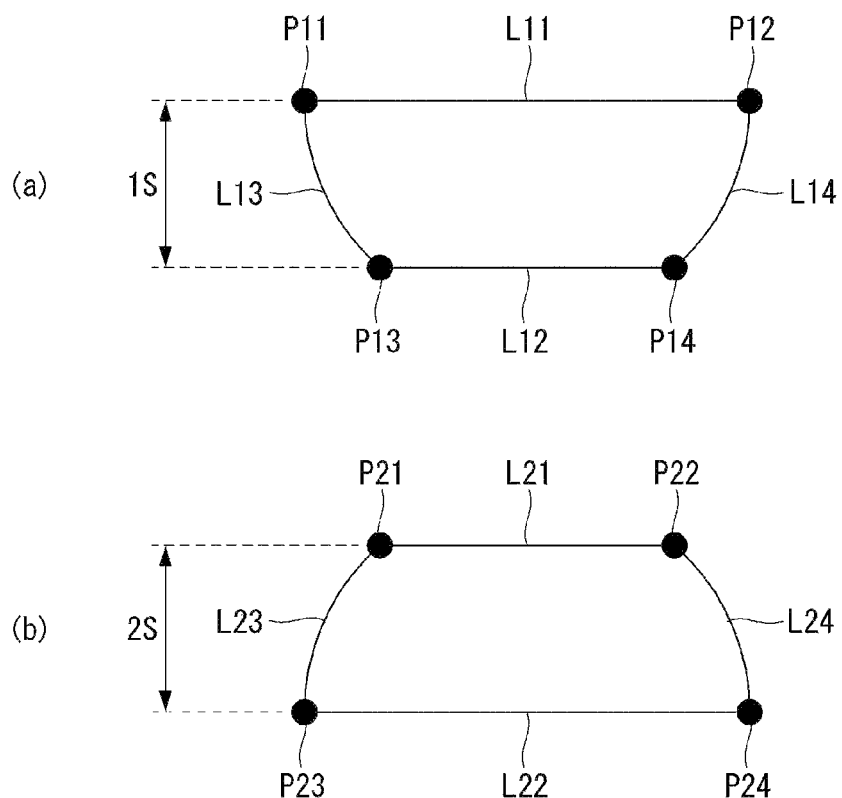

Referring to FIGS. 8 and 9, the side sealant SL is applied to extend in one direction (hereinafter, referred to as a "first direction") from a region where the sealing area SLA is defined. The side sealant SL thus extends lengthwise in the first direction, and widthwise in a direction that is perpendicular to the first direction. The side sealant SL is applied to the sealing area SLA and has a preset pattern 100.

The preset pattern 100 has a first width W1 and a second width W2. The second width W2 is smaller than the first width W1. The preset pattern 100 may be a pattern alternated in units of one pattern having the first width W1 and the second width W2. That is, the widths of the side sealant SL may be varied in order of the first width W1 and the second width W2 in the first direction.

The first widths W1 and W3 (note that the width W3 may be the same as the first width W1, as shown in FIG. 8, and is thus referred to herein as the first width) may be the same as the reference width Wr. As noted above, the widths of the side sealant SL may be varied in order (e.g., in an alternating pattern) of the first width W1 and the second width W2 (e.g., as shown in FIG. 8(a), where widths W1, W3 and W5 are all first widths and are equal to each other, and widths W2 and W4 are second widths that are equal to each other). In one or more embodiments, the pattern 100 may include a third width (e.g., where the width W4 is narrower than the first width W1, and different from the second width W2) that is different than the second width W2. In such a case, the preset pattern 100 may be a pattern having alternating units of two patterns, including a pattern having the first width W1 and the second width W2, and a pattern having the first width W3 and the third width W4. That is, the widths of the side sealant SL may be varied in order of the first width W1, the second width W2, the first width W3, and the third width W4 in the first direction.

In one or more embodiments, in the preset pattern 100, opposing sides determining the first width W1 and opposing sides determining the second width W2 may be connected by curved lines (as shown in FIG. 8(a)). In other embodiments, in the preset pattern 100, opposing sides determining the first width W1 and opposing sides determining the second width W2 may be connected by linear lines (as shown in FIG. 8(b)).

In other words, the preset pattern 100 includes a first section 1S and a second section 2S. The first section 1S refers to a section in which a width thereof is narrowed in the first direction (e.g., in the direction from W1 to W2). The second section 2S refers to a section in which a width thereof is increased in the first direction (e.g., from W2 to W3). The preset pattern 100 may be a pattern in which the first section 1S and the second section 2S alternate.

As shown in FIG. 9(a), a planar shape of the first section 1S may be defined by a first side L11 connecting a first point P11 and a second point P12, a second side L12 connecting a third point P13 and a fourth point P14, a third side L13 connecting the first point P11 and the third point P13, and a fourth side L14 connecting the second point P12 and the fourth point P14. The first side L11 of the first section 1S determines a start width of the first section 1S. The start width of the first section 1S refers to a largest width in the first section 1S. The second side L12 of the first section 1S determines an end width of the first section 1S. The end width of the first section 1S refers to a narrowest width in the first section 1S.

As shown in FIG. 9(b), a planar shape of the second section 2S may be defined by a first side L21 connecting a first point P21 and a second point P22, a second side L22 connecting a third point P23 and a fourth point P24, a third side L23 connecting the first point P21 and the third point P23, and a fourth side L24 connecting the second point P22 and the fourth point P24. The first side L21 of the second section 2S determines a start width of the second section 2S. The start width of the second section 2S refers to a largest width in the second section 2S. The second side L22 of the second section 2S determines an end width of the second section 2S. The end width of the second section 2S refers to a narrowest width in the second section 2S.

The start widths W1 and W3 of neighboring sections 1_1S and 1_2S may be different. However, preferably, the start widths W1 and W3 of the sections 1_1S and 1_2S are the same as the reference width Wr. The start widths W2 and W4 of neighboring sections 2_1S and 2_2S may be different. In other words, the end widths W2 and W4 of the sections 1_1S and 1_2S may be different.

The third sides L13 and L23 and the fourth sides L14 and L24 of the first section 1S and the second section 2S may be a curved line. For example, a planar shape of the side sealant SL may be a shape in which a plurality of circles (or ovals) are arranged in the first direction and neighboring circles partially overlap each other (as shown in FIG. 8(a)). The third sides L13 and L23 and the fourth sides L14 and L24 may be a linear line. For example, a planar shape of the side sealant SL may be a shape in which a plurality of diamonds are arranged in the first direction and neighboring diamonds partially overlap each other (as shown in FIG. 8(b)). Additionally or alternatively, any one of the third sides L13 and L23 and the fourth sides L14 and L24 may be a curved line and the other may be a linear line.

The side sealant SL may have various patterns with the first width W1 and the second width W2 (and further may have various patterns including the third width W4, e.g., where the second and third widths W2, W4 are different). However, when the third sides L13 and L23 and the fourth sides L14 and L24 are formed as linear lines, stress may concentrate on a specific region such as a corner or a vertex. Thus, the third sides L13 and L23 and the fourth sides L14 and L24 may be formed as curved lines such that stress may be effectively distributed, rather than concentrating on a specific region.

Figure 10:
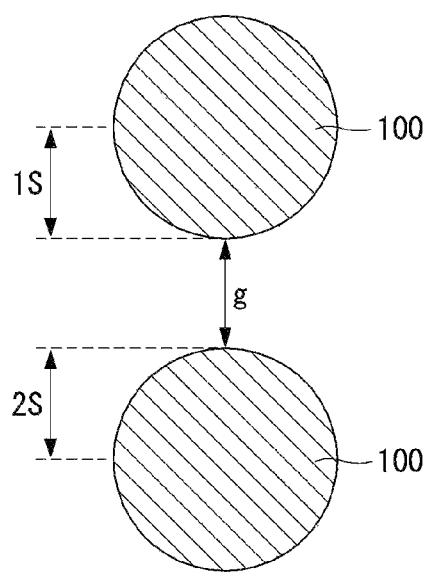

Referring further to FIG. 10, the first section 1S and the second section 2S may be connected without a gap therebetween. If the first section 1S and the second section 2S are separated, oxygen or moisture may be introduced to the space, making it difficult to compensate for a step. That is, the purpose of applying the side sealant may be difficult to achieve.

Figure 11:
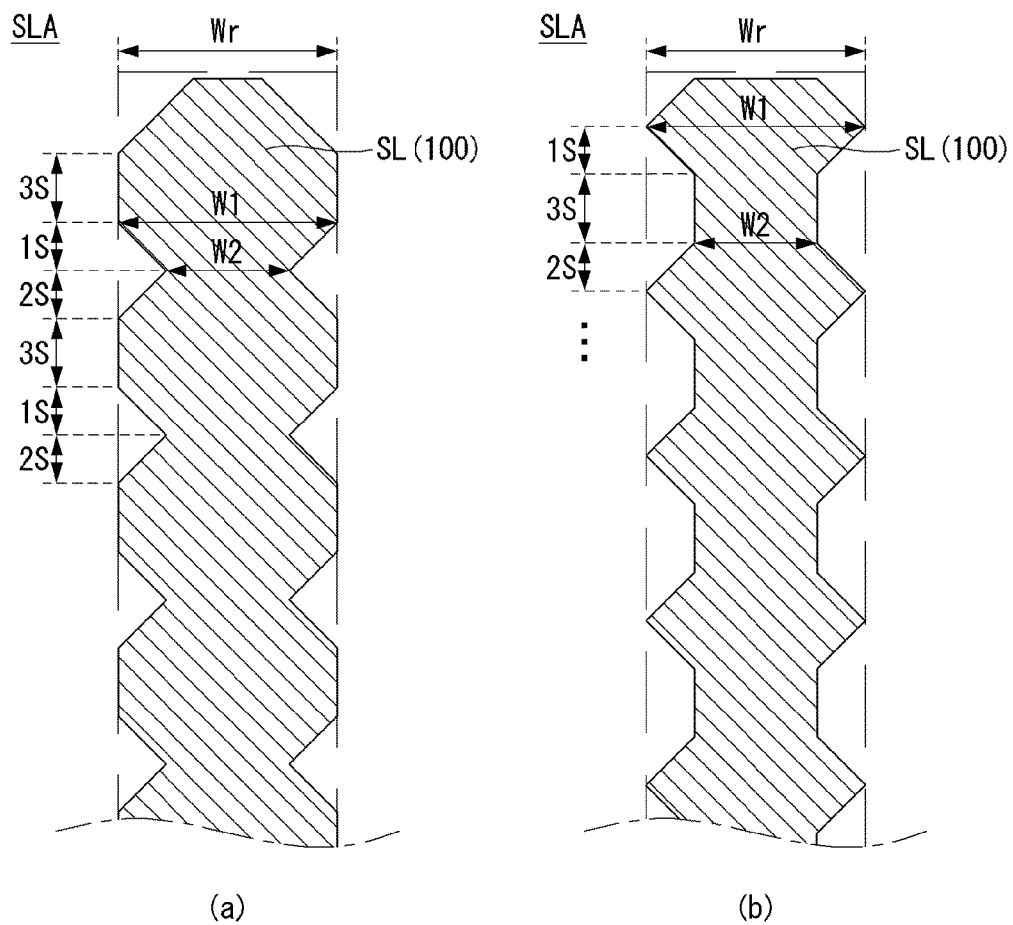

Referring to FIG. 11, the preset pattern 100 may further include a third section 3S. The third section 3S may be defined between the first section 1S and the second section 2S. The third section 3S refers to a section in which a width thereof is uniform in the first direction. The width of the third section 3S may be the same as the start width W1 of the first section 1S (as shown in FIG. 11(a)) or may be the same as the start width W2 of the second section 2S (as shown in FIG. 11(b)).

Figure 12:
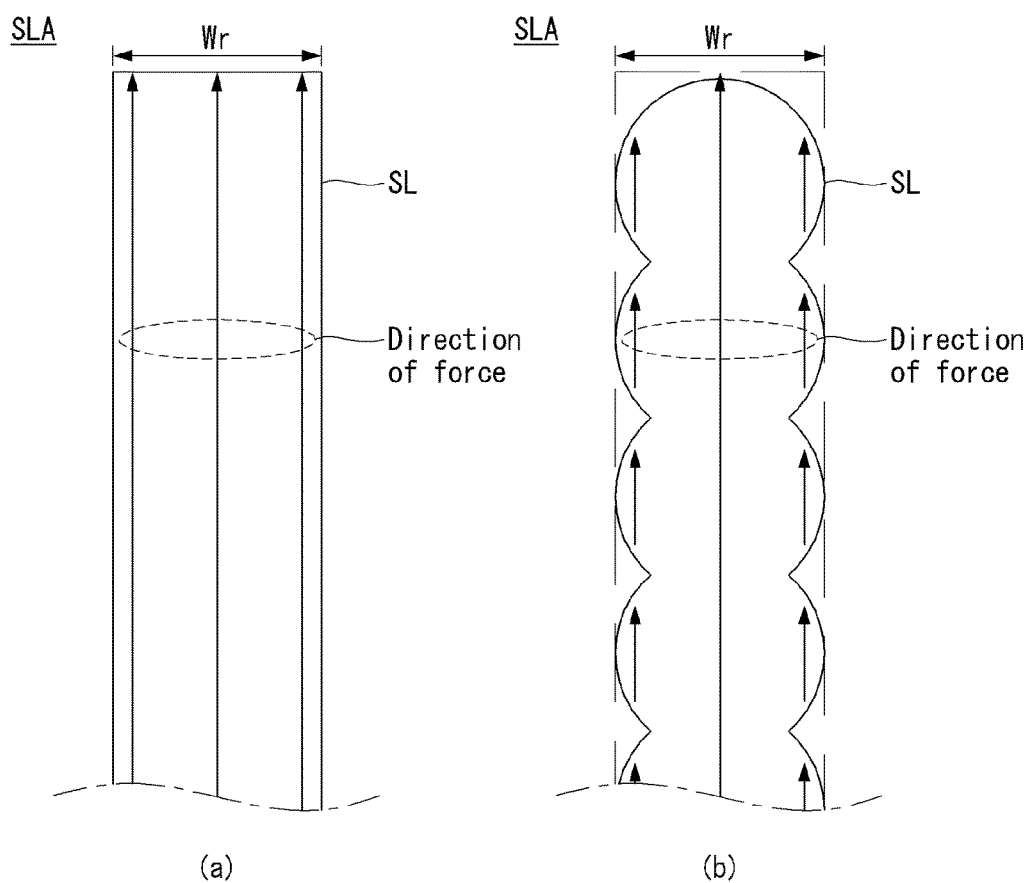
FIGS. 12 and 13 are views illustrating an effect of one or more embodiments of the present disclosure.
Figure 13:
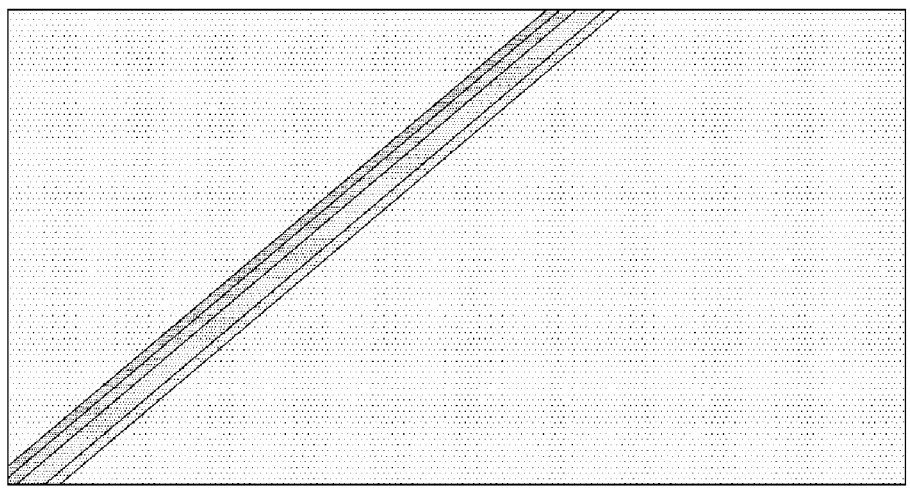
Figure 13:
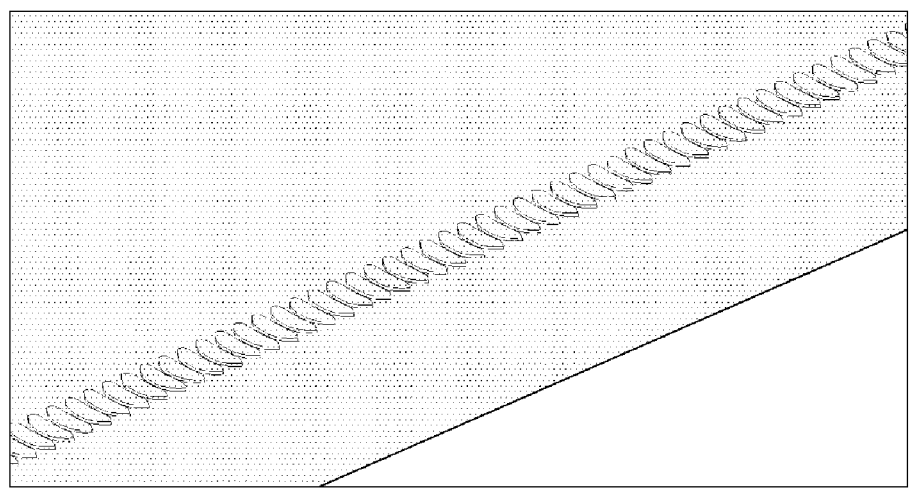

Hereinafter, an effect of embodiments of the present disclosure will be described with reference to FIGS. 12 and 13. FIGS. 12 and 13 are views illustrating an effect of the first embodiment of the present disclosure.

Hereinafter, in order to describe an improved effect of the present disclosure, a side sealant SL according to an embodiment of the present disclosure and a side sealant SL formed to have a linear pattern will be comparatively described.

Referring to FIG. 12(a), a side sealant SL may be formed to have a linear shape within the sealing area SLA. The linear side sealant pattern 100 may have a predetermined reference width Wr to perform an intrinsic function thereof. When a flexible display panel is rolled and/or folded, a force acts on the side sealant pattern 100. The linear side sealant pattern 100 extends with the predetermined width Wr in a direction in which the force acts. Thus, the force continuously acts on the linear side sealant SL (as shown in FIG. 12(a)).

In contrast, the side sealant pattern 100 according to an embodiment of the present disclosure extends with a non-uniform width in a direction in which a force acts (as shown in FIG. 12(b)). Thus, the force acts discontinuously on the side sealant pattern 100 according to the embodiment. This means that a path along which the force acts (or a transfer path of the force) may be partially disconnected. Thus, in the various embodiments of the present disclosure, when the flexible display panel is rolled, stress acting on the sealant pattern may be advantageously reduced, compared with the linear side sealant pattern.

FIG. 13 is a view illustrating simulation results showing degrees of bending stress acting on the side sealant SL pattern according to an embodiment of the present disclosure (shown in FIG. 13(b)) and the linear side sealant pattern (shown in FIG. 13(a)). The side sealant pattern according to an embodiment of the present disclosure applied to the experimentation has a shape in which a plurality of circles having a predetermined diameter are disposed in one direction and partially overlap each other. The linear side sealant pattern as a comparison target has the same width as that of the diameter and has a linear shape extending in one direction. The experimentation was conducted under the same conditions, except for the shapes of the side sealant pattern. The simulation results are expressed in different shades according to magnitudes of stress acting on the side sealant patterns and expressed in a darker shade corresponding to the increase of the stress value.

Referring to (a) of FIG. 13, the simulation results are expressed in different shades according to positions and expressed in dark shades. This means that stress acting on the linear side sealant pattern is large and differences in stress are significant according to positions.

Referring to (b) of FIG. 13, the simulation results are expressed in light shades in the entire area without being differentiated according to positions. This means that stress acting on the side sealant pattern according to an embodiment of the present disclosure is relatively small, and since stress is effectively distributed, differences in stress are insignificant (small) according to positions.

As can be seen from the simulation results, in the various embodiments of the present disclosure, since the side sealant having a preset pattern is provided, stress acting on the side sealant may be reduced and effectively distributed. Thus, by forming the side sealant securing sufficient flexibility, a flexible organic light emitting display device having enhanced product reliability and product stability may be provided.

<Additional Embodiment>

Figure 14:
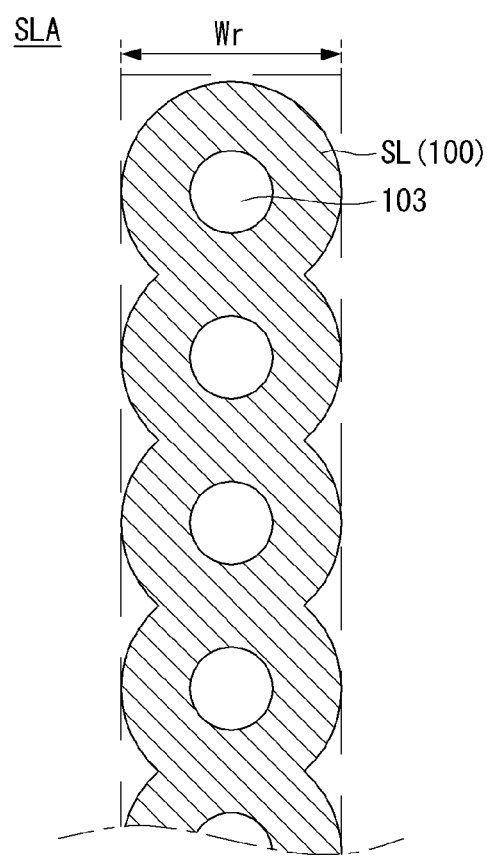
FIG. 14 is a view illustrating a flexible organic light emitting display device according to another embodiment of the present disclosure.

Hereinafter, a flexible organic light emitting display device according to an additional embodiment of the present disclosure will be described with reference to FIG. 14. FIG. 14 is a view illustrating a flexible organic light emitting display device according to an additional embodiment of the present disclosure.

Referring to FIG. 14, a side sealant SL having a preset pattern 100 may include at least one hollow 103. The at least one hollow 103 penetrates through the inside of the side sealant SL. The plurality of hollows 103 may be disposed to be spaced apart from each other at a predetermined interval. In the drawing, a case in which a planar shape of the hollow 103 is a substantially circular shape is illustrated as an example, but the present disclosure is not limited thereto.

In the additional embodiment of the present disclosure, since the hollow 103 is formed on the inner side of the side sealant SL, a path along which a force acts may be more effectively disconnected. Accordingly, in the additional embodiment of the present disclosure, when a flexible display panel is rolled, stress acting on the side sealant SL pattern may be more effectively reduced, compared with the linear side sealant SL pattern.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible organic light emitting display device comprising:
   a substrate having a display area and a non-display area; and
   a side sealant covering a portion of the substrate in the non-display area,
   wherein the side sealant is disposed in a pattern having a first width and a second width narrower than the first width, the first width and the second width being alternately arranged with respect to one another in a direction in which a force acts when the substrate is rolled or folded.

2. The flexible organic light emitting display device of claim 1, wherein the side sealant pattern includes a third width that is narrower than first width and different from the second width, and the side sealant pattern includes a first portion having the first width and the second width and a second portion having the first width and the third width, the first and second portions being alternately arranged with respect to one another.

3. The flexible organic light emitting display device of claim 1, wherein opposing sides determining the first width and opposing sides determining the second width are connected by curved lines, respectively.

4. The flexible organic light emitting display device of claim 1, wherein opposing sides determining the first width and opposing sides determining the second width are connected by linear lines, respectively.

5. The flexible organic light emitting display device of claim 1, further comprising:
   a hollow region extending through an inside portion of the side sealant pattern.

6. The flexible organic light emitting display device of claim 1, further comprising:
   an encapsulation layer covering the display area,
   wherein the side sealant pattern is in contact with a side surface of the encapsulation layer.

7. The flexible organic light emitting display device of claim 6, further comprising:
   a flexible film bonded to at least one side of the non-display area,
   wherein the side sealant covers an upper surface of an edge of the flexible film.

8. A flexible organic light emitting display device comprising:
   a flexible substrate having a display area and a non-display area;
   an encapsulation layer covering the display area;
   a flexible film bonded to the substrate in the non-display area; and
   a sealant in the non-display area, the sealant covering at least a portion of the flexible film and contacting a side surface of the encapsulation layer, the sealant extending lengthwise in a first direction in the non-display area and widthwise in a second direction that is perpendicular to the first direction, the sealant including:
   a plurality of first sections having a first width, and
   a plurality of second sections having a second width that is narrower than the first width, the second sections being positioned between respective first sections wherein the first sections and the second sections are alternately arranged with respect to one another in a direction in which a force acts when the flexible substrate is rolled or folded.

9. The flexible organic light emitting display device of claim 8, wherein the sealant has a curved outer shape between the first sections and the second sections.

10. The flexible organic light emitting display device of claim 8, wherein the sealant has a linear outer shape between the first sections and the second sections.

11. The flexible organic light emitting display device of claim 8, wherein the sealant includes a hollow region extending through an inner portion of the sealant.

* * * * *